United States Patent
Xiao et al.

(10) Patent No.: US 9,754,761 B2
(45) Date of Patent: Sep. 5, 2017

(54) HIGH-SPEED HOTSPOT OR DEFECT IMAGING WITH A CHARGED PARTICLE BEAM SYSTEM

(71) Applicant: KLA-TENCOR CORPORATION, Milpitas, CA (US)

(72) Inventors: Hong Xiao, Pleasanton, CA (US); Christopher Maher, Campbell, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/162,249

(22) Filed: May 23, 2016

(65) Prior Publication Data

US 2016/0351373 A1    Dec. 1, 2016

Related U.S. Application Data

(60) Provisional application No. 62/166,245, filed on May 26, 2015.

(51) Int. Cl.
| | |
|---|---|
| H01J 37/26 | (2006.01) |
| H01J 37/147 | (2006.01) |
| H01J 37/20 | (2006.01) |
| H01J 37/06 | (2006.01) |

(52) U.S. Cl.
CPC .......... *H01J 37/1477* (2013.01); *H01J 37/06* (2013.01); *H01J 37/20* (2013.01); *H01J 2237/12* (2013.01)

(58) Field of Classification Search
USPC .... 250/306, 307, 309, 310, 311, 396 R, 397, 250/492.1, 492.2, 492.21, 492.22, 492.23, 250/492.3
See application file for complete search history.

(56) References Cited

U.S. PATENT DOCUMENTS

| | | | | |
|---|---|---|---|---|
| 5,304,441 | A  * | 4/1994 | Samuels | H01J 37/3026 430/296 |
| 7,696,487 | B2 | 4/2010 | Hayakawa et al. | |
| 7,796,801 | B2 | 9/2010 | Kitamura et al. | |
| 7,982,186 | B2 | 7/2011 | Kanai et al. | |
| 8,134,697 | B2 | 3/2012 | Hayakawa et al. | |
| 8,330,103 | B2 | 12/2012 | Enyama et al. | |
| 8,755,045 | B2 | 6/2014 | Lin et al. | |
| 2002/0130274 | A1* | 9/2002 | Ferrera | B82Y 10/00 250/492.1 |
| 2008/0142712 | A1 | 6/2008 | Agemura et al. | |
| 2010/0300873 | A1* | 12/2010 | Blackwood | G01N 1/32 204/192.33 |
| 2012/0145894 | A1 | 6/2012 | Wu et al. | |
| 2012/0305768 | A1 | 12/2012 | Yamamoto et al. | |
| 2014/0185918 | A1 | 7/2014 | Hirai et al. | |
| 2014/0319342 | A1 | 10/2014 | Fan et al. | |

\* cited by examiner

*Primary Examiner* — Nicole Ippolito
(74) *Attorney, Agent, or Firm* — Hodgson Russ LLP (57) ABSTRACT

An inspection tool includes a controller that is configured to generate a scan pattern for an electron beam to image areas of interest on the wafer. The scan pattern minimizes dwell time of the electron beam on the surface of the wafer between the areas of interest. At least one stage speed and at least one raster pattern can be selected based on the areas of interest. The controller sends instructions to electron beam optics to direct the electron beam at the areas of interest on the surface of the wafer using the scan pattern.

18 Claims, 11 Drawing Sheets

HIGH-SPEED HOTSPOT OR DEFECT IMAGING WITH A CHARGED PARTICLE BEAM SYSTEM

CROSS-REFERENCE TO RELATED APPLICATIONS

This application claims priority to the provisional patent application filed May 26, 2015 and assigned U.S. application Ser. No. 62/166,245, the disclosure of which is hereby incorporated by reference.

FIELD OF THE DISCLOSURE

This disclosure relates to wafer inspection and, more particularly, to wafer inspection using a charged particle beam system.

BACKGROUND OF THE DISCLOSURE

Wafer inspection systems help a semiconductor manufacturer increase and maintain integrated circuit (IC) chip yields by detecting defects that occur during the manufacturing process. One purpose of inspection systems is to monitor whether a manufacturing process meets specifications. The system indicates the problem and/or the source of the problem if the manufacturing process is outside the scope of established norms, which the semiconductor manufacturer can then address.

Defect detection sensitivity and throughput are coupled in inspection systems such that greater sensitivity usually means lower throughput. There are both physical and economic reasons for this relationship. Semiconductor manufacturers demand improved sensitivity from inspection systems, but require a minimum throughput.

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production. Thus, minimizing the total time from detecting a yield problem to fixing it determines the return-on-investment for the semiconductor manufacturer.

In IC manufacturing, patterns sensitive to photolithography are called "litho hotspots" ("hotspots" for short). Hotspots can be formed during manufacturing or by interactions between manufacturing process steps. For example, a certain feature may be difficult to fill, so this is a place where an open can occur. Thus, the feature may have printed correctly, but did not fill correctly. As feature sizes shrink in advanced technology nodes, the number of hotspots increases. Inspection of hotspots can be challenging because hotspots are small. For example, hotspots can be on the order of 10 nm.

Previous techniques to inspect hotspots involved an image time of less than 10 ms, but the overhead of stage moving, settling, aligning, and focusing was usually about 150 ms to 200 ms. Therefore, the effectiveness of the inspection was very low because approximately 95% of operation time was overhead and only approximately 5% of operation time was actually running inspection.

Therefore, what is needed is improved wafer inspection using a charged particle beam system.

BRIEF SUMMARY OF THE DISCLOSURE

In a first embodiment, an inspection tool is provided. The inspection tool comprises an electron beam generator unit configured to generate an electron beam; a stage configured to clamp a wafer; at least one actuator configured to move the stage; electron beam optics configured to direct the electron beam at a surface of the wafer; a detector configured to detect electrons from the electron beam; and a controller in electronic communication with at least the electron beam optics and the actuator. The controller is configured to receive instructions including at least two areas of interest in a swath of the wafer to be scanned by the electron beam. The controller is configured to generate a scan pattern for the electron beam to image the areas of interest on the wafer. The scan pattern minimizes dwell time of the electron beam on the surface of the wafer between the areas of interest. The controller selects at least one stage speed and at least one raster pattern based on the areas of interest in the swath. The controller is configured to send instructions to the electron beam optics to direct the electron beam at the areas on the surface of the wafer using the scan pattern.

The electron beam optics may be configured to scan the electron beam across the surface of the wafer in two perpendicular directions. The stage may be configured to move in two perpendicular directions.

The controller may be configured to send instructions to move the stage while the electron beam optics scans the electron beam. The controller can be further configured to use a reference point on the wafer to generate the scan pattern for the wafer. The controller also can be further configured to generate the scan pattern to capture the areas of interest while minimizing inspection time.

In a second embodiment, a method is provided. The method comprises generating a scan pattern for an electron beam to image at least two areas of interest in a swath of a wafer and directing the electron beam over the surface of the wafer using the scan pattern. The scan pattern minimizes dwell time of the electron beam on the surface of the wafer between the areas of interest. At least one stage speed and at least one raster pattern are selected for the scan pattern based on the areas of interest in the swath.

The method can include moving a stage clamping the wafer. The moving may be configured to be in two perpendicular directions. The moving and the directing may be sequential. The moving and the directing may be simultaneous. The moving may be at a constant speed during the directing.

The wafer can include at least one area of interest in a different swath. The scanning can occur in the different swath of the wafer during the moving.

The moving and the directing may not be at normal angles with respect to each other. For example, the moving and the directing can be at a 45° angle with respect to each other.

The directing may be configured to be in two perpendicular directions.

The directing may include only partially directing the electron beam over one of the areas of interest. Completing the directing of the electron beam over the area of interest occurs after directing the electron beam over another of the areas of interest.

The generating can further include capturing the areas of interest while minimizing inspection time.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The system and methods disclosed herein provide highly-effective inspection of areas of interest (AOIs), such as hotspots, using a charged particle beam imaging system. The charged particle beam imaging system may be an electron beam inspection (EBI) system. Overhead is reduced and electron beam scanning effectiveness is improved using embodiments disclosed herein because only AOIs are imaged. Areas a user is not interested in are skipped during inspection. The imaging can occur with continuous or sequential stage movement.

Image collection can occur during stage movement in any direction. With flexible stage movement, the most efficient path can be defined to enable the fastest possible AOI inspection. Complex beam raster schemes are enabled, which can reduce the impact of charging artifacts on defect detection. This can provide better sensitivity to small systematic defects and better classification. Variable stage speed also can be enabled, which can allow for efficient AOI inspection with a varying degree of AOI density across a die or wafer. Stage speed can run slower where AOIs are dense, and faster when AOIs are widely spaced. Furthermore, different types of scanning can be implemented to provide optimized inspection. For example, the system can use continuous stage movement, step and scan, or a combination of continuous stage movement and step and scan across a surface of a wafer. The design or position of the AOIs can be used to optimize inspection of a wafer, enabling the system to focus on the AOIs and not merely skip areas between AOIs.

As used herein, the term "wafer" generally refers to substrates formed of a semiconductor or non-semiconductor material. Examples of such a semiconductor or non-semiconductor material include, but are not limited to, monocrystalline silicon, gallium nitride, gallium arsenide, indium phosphide, sapphire, and glass. Such substrates may be commonly found and/or processed in semiconductor fabrication facilities.

A wafer may include one or more layers formed upon a substrate. For example, such layers may include, but are not limited to, a photoresist, a dielectric material, a conductive material, and a semiconductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features or periodic structures. Formation and processing of such layers of material may ultimately result in completed devices. Many different types of devices may be formed on a wafer, and the term wafer as used herein is intended to encompass a wafer on which any type of device known in the art is being fabricated.

Figure 1:
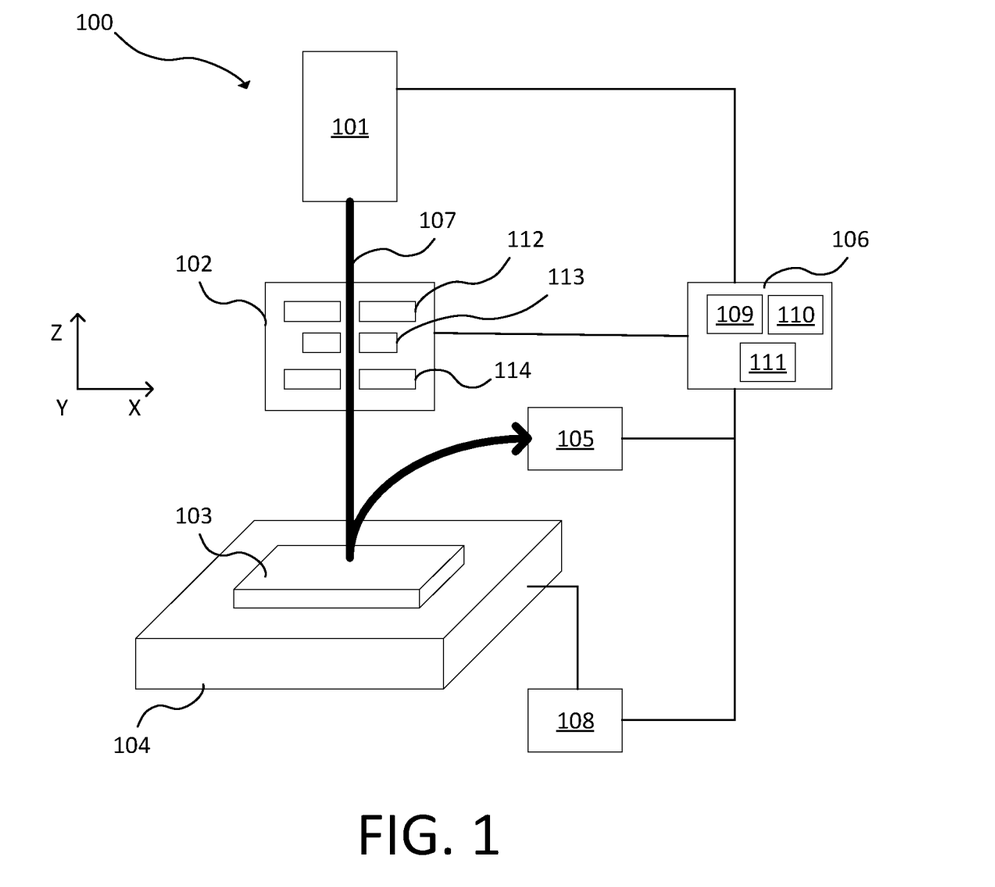
FIG. 1 is a schematic diagram of an electron beam inspection system in accordance with an embodiment of the disclosure.

FIG. 1 is a schematic diagram of an electron beam inspection system 100, which includes an electron beam generator 101 that generates the electron beam 107, a stage 104 configured to clamp a wafer 103, and electron beam optics 102. The system 100 is configured to scan a wafer 103 with the electron beam 107 during inspection.

The electron beam generator 101 may be, for example, an electron gun. The electron beam generator 101 can be configured to produce an electron beam 107 with desired collimation, current, or dimensions. Beam current may be, for example, from 50 pA to 50 nA. Beam spot may be, for example, from 1 nm to 25 nm.

The electron beam optics 102 are configured to direct the electron beam 107 at a surface of the wafer 103. The electron beam optics can include one or more lenses, which may be electrodes. Three lenses 112-114 are illustrated in FIG. 1, but other configurations known to those skilled in the art are possible. In an example, the electron beam optics 102 can scan the electron beam 107 across one or more selected regions of the wafer 103. This may be accomplished by biasing one or more electrodes in the lenses 112-114 of the electron beam optics 102.

The electron beam optics 102 can adjust bias voltage or can adjust beam current of the electron beam 107. The electron beam optics 102 also can vary process parameters such as electron-optic focus parameters, electron beam scanning parameters (e.g., scanning pattern, scan-line density, scan-line spacing, electron beam scanning speed, scanning range, or field of scanning), or image forming parameters (e.g., extraction voltage, extraction field strength for secondary electrons, or electron landing energy).

At least one actuator 108 is configured to move the stage 104. Adjustable parameters of the actuator 108 or stage 104 include scanning speed, direction of movement, angle of movement, and other parameters. The actuator 108 can move the stage 104 in the x-direction, y-direction, or z-direction. The actuator 108 also can rotate the stage 104 along a rotational direction. For example, the actuator 108 can rotate the stage 104 about the z-axis.

The chamber or region around the stage 104 can be configured to enable a maximum range of desired movement of the stage 104 or a maximum speed of the stage 104.

The stage 104 may be biased or grounded. Bias to the stage 104 can be adjusted. The stage 104 can clamp the wafer 103 with an electrostatic and/or mechanical force.

The electron beam optics 102 and actuator 108 of the stage 104 can work simultaneously or independent of each other to perform a scan of the wafer 103 using the electron beam 107. Parameters of various components of the electron beam inspection system 100 can be adjusted to achieve a desired scan.

The electron beam 107 is collected by the electron detector 105. The electron detector 105 can include one or more of a secondary electron collector or a scintillating element and photomultiplier detector. Extraction voltage, electron landing energy, or the extraction field strength for the secondary electrons can be controlled.

A controller 106 is in electronic communication with at least the electron beam generator 101, electron beam optics 102, electron detector 105, and actuator 108. The controller 106 may be in electronic communication with other components or systems of the electron beam inspection system 100. The controller 106 can adjust process parameters of the electron beam generator 101 (e.g., beam current), actuator 108 (e.g., scanning speed), or electron beam optics 102 (e.g., focus of the electron beam 107 or scanning pattern). The controller 106 also can adjust digitization parameters (e.g., digitization or pixel data rate).

The controller 106 includes a processor 109, a storage device 110 in electronic communication with the processor 109, and a communication port 111 in electronic communication with the processor 109. It is to be appreciated that the controller 106 may be implemented in practice by any combination of hardware, software, and firmware. Also, its functions as described herein may be performed by one unit, or divided up among different components, each of which may be implemented in turn by any combination of hardware, software and firmware. Program code or instructions for the controller 106 to implement the various methods and functions described herein may be stored in controller readable storage media, such as a memory, within the controller 106, external to the controller 106, or combinations thereof.

Figure 2:
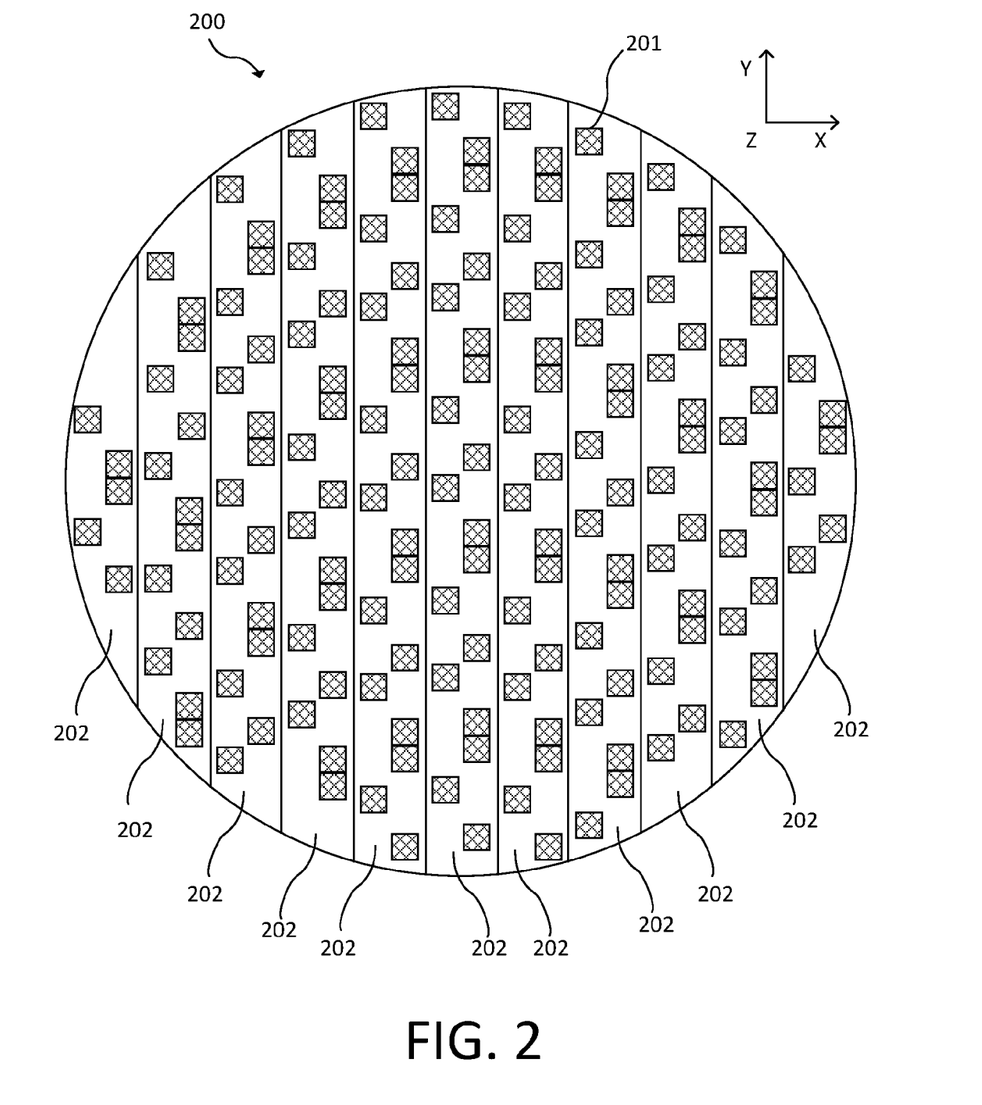
FIG. 2 represents a wafer with swaths and areas of interest (AOIs)

FIG. 2 represents a wafer 200 with swaths 202 and AOIs 201. The AOIs 201 are represented by hatched regions. The wafer 200 is an example of a surface of a wafer 103 from FIG. 1. The wafer 200 may be, for example, a 200 mm, 300 mm, or 450 mm diameter semiconductor wafer. Other wafer surface designs besides that illustrated in FIG. 2 are possible.

The swaths 202 are a part of a wafer 200. In an example, the swath 202 is a stripe across part of a surface of the wafer 200. Eleven swaths 202 are illustrated in FIG. 2, though other numbers or arrangements of swaths 202 are possible. Each swath 202 may be, for example, approximately 1 μm to 100 μm in width. However, width of a swath 202 may be determined by the density or distance between AOIs 201 to optimize inspection of the wafer 200.

As seen in FIG. 2, the AOIs 201 occupy less than an entirety of the swath 202. For example, the AOIs 201 can occupy less than 50% of a respective swath 202. The exact percentage of a swath 202 occupied by AOIs 201 can vary. The percentage of the swath 202 occupied by AOIs 201 can depend on the dimensions of the swath 202 and the size of the AOIs 201, both of which can vary.

In an example, step and scan frame sizes along a swath 202 can be up to 12 k pixels by 12 k pixels. Pixel size can be from 2 nm to 10 nm for this example, so frame size may be 120 μm by 120 μm. Hotspots may be only a few nm in size, but it may be necessary to image a larger area because of location uncertainty and to allow the algorithms to work. 128 pixels by 128 pixels may be needed for a hot spot, but smaller pixel areas may be possible (e.g., 64 pixels by 64 pixels). If there are 100 hotspots in a frame, then the hotspots are only 0.01% of the area.

For swathing, the height of the scan size may not be elongated because the frame size dimension may not be determined by the field of view of the optics. Thus, the height can be as large as desired. Overheads can be low because the stage can keep moving and the speed can be adjusted. For example, speed may be faster to inspect sparsely separated hot spots or slower to inspect very dense hot spots. If only 1% of the area needs to be inspected, then this means the stage can potentially be run 100× faster. A large field of view in the height direction may be needed to run 100× faster, so the speed may be limited. If hot spots were only 0.01% of the area and not distributed evenly, the system may decide if it is more economical to step and settle, swath with a flexible path, or perform a combination of the two.

FIG. 2 illustrates the AOIs 201 as approximately square. The AOIs 201 can be other shapes, such as rectangles, polygons, circles, or ovals.

Imaging the entire swath 202 includes regions of the swath 202 besides the AOIs 201. By imaging an entire swath 202 an electron beam inspection system will waste time imaging regions not of interest to a semiconductor manufacturer. Imaging an entire swath 202 increases overhead and reduces scanning effectiveness.

Figure 3:
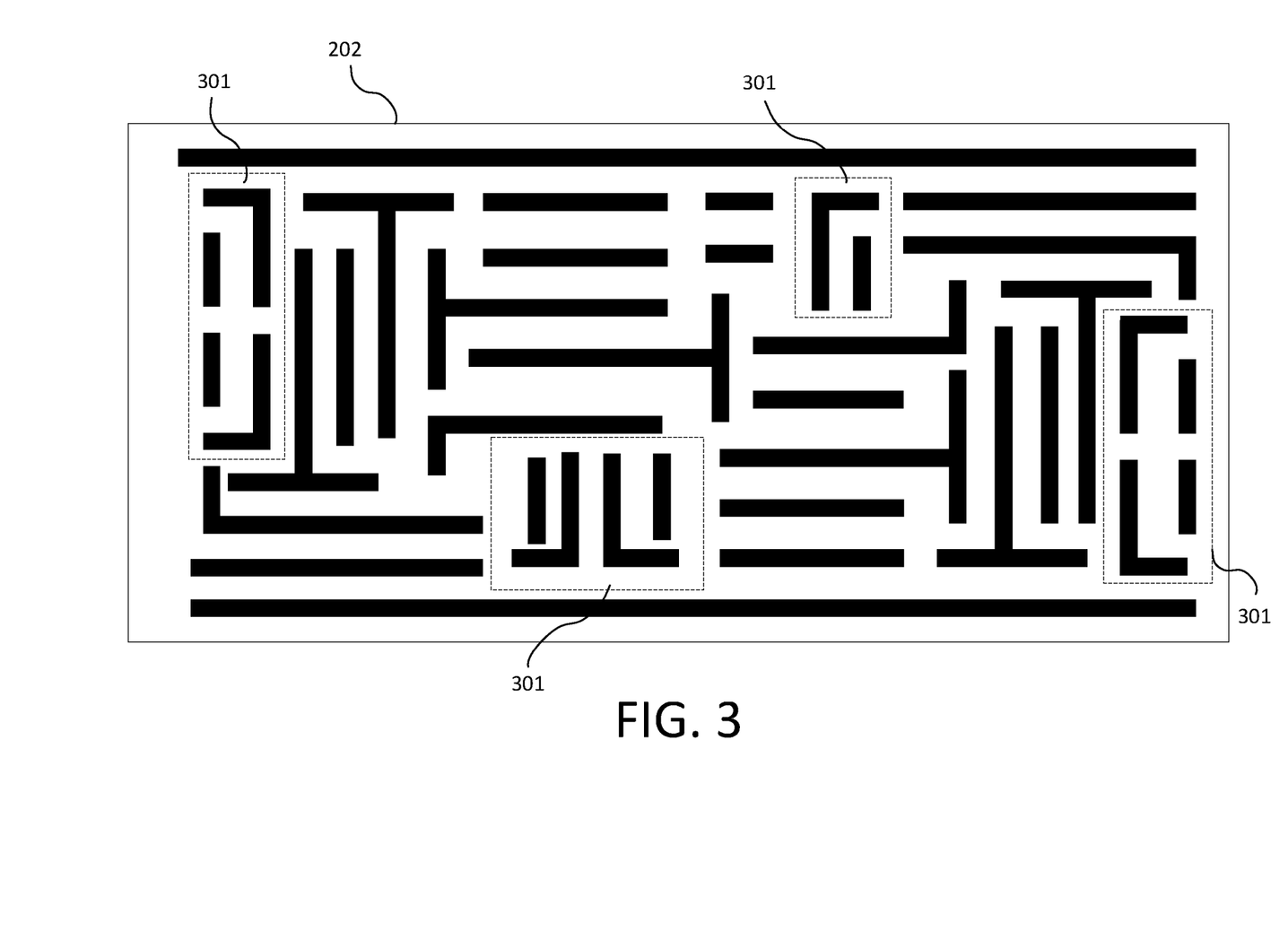
FIG. 3 represents a swath of a wafer with AOIs marked using boxes.

FIG. 3 represents a swath 202 of a wafer, such as wafer 200, with AOIs 301 marked using boxes. The AOIs 301 may correspond to the AOIs 201 in FIG. 2. As seen in FIG. 3, each AOI 301 can include one or more devices or structures on the wafer. In an example, the AOI 301 includes a hotspot. Though, the AOI 301 may include other features instead of hotspots. For example, a "warm spot" can be caused by combined effects of lithography, etch, deposition and CMP processes. Warm spots or other types of AOIs can be imaged or inspected using techniques disclosed herein.

Figure 4:
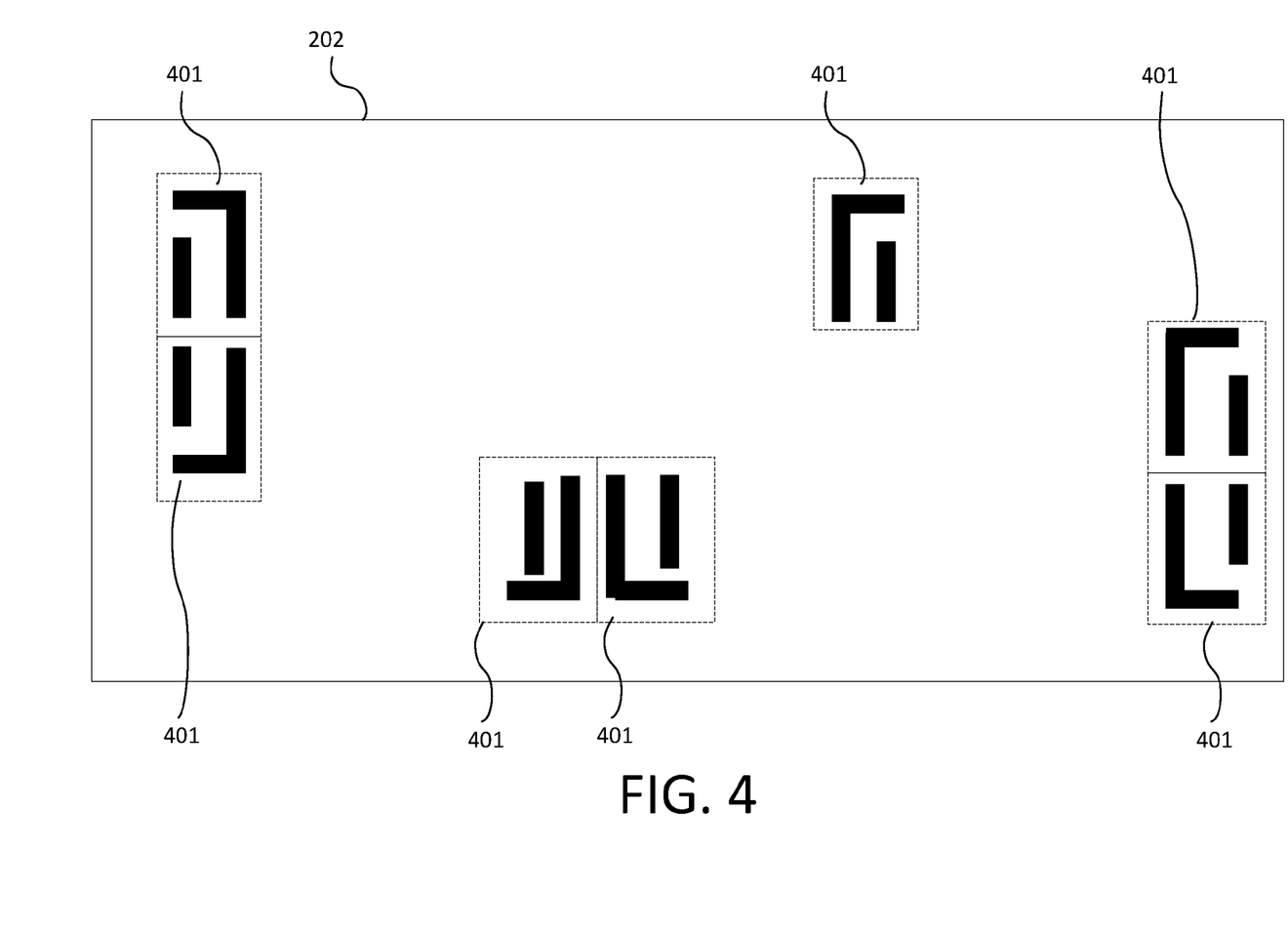
FIG. 4 represents swath imaging of only the AOIs.

FIG. 4 represents swath imaging of only the AOIs 401 marked using boxes. As seem if compared to FIG. 3, the swath 202 includes devices or structures between the AOIs 401, but these areas will not be imaged.

The AOIs selected by a user can be further divided by the controller. In comparing FIG. 3 and FIG. 4, some of the AOIs 301 are further divided into multiple AOIs 401. This may optimize scanning or throughput. For example, throughput may be increased if an AOI 301 is divided into two AOIs 401 because sparse points may be best scanned using a step and scan technique while dense points may need flexible swathing techniques. An AOI 301 also may be divided to provide different raster techniques on each part of the AOI 301 to improve beam sensitivity. Complex raster techniques may decrease overall throughput, so it may be desirable to limit areas where the complex raster techniques are used.

Thus, optimized sensitivity and throughput can be achieved by varying areas with step and scan versus swath scan, swath direction (e.g., straight or curved), stage speed, or image raster direction. For example, stage speed can be faster for sparse spots, slower for dense spots, and step and scan for very dense spots. Raster direction can be up-down, north-south-east-west, diamond, left-right, or other configurations. Distance between AOIs 401 also can affect stage speed or raster direction.

The stage can move at constant speed during inspection of the AOIs 401. AOIs 401 can be scanned with the electron beam while the stage moves. The electron beam can move to the next AOI 401 by deflecting the electron beam while the stage is continuously moving. The speed of stage movement can be determined by the density of the AOIs 401 or other factors. In an example, maximum stage movement can be 200 mm/second.

For example, the movement of the stage can speed up proportional to the amount of area on the surface of the wafer that is skipped during inspection. Maximum stage speed can be limited. One potential limiting factor is the field of view of the optics in the direction the stage is moving. Faster stage movement can be achieved if only one line is rastered, but the stage may need to allow the raster to complete its sweep before the hot spot moves out of the field of view. A large field of view can be complex to design. Typical field of views are 100 µm to 1 mm. Another potential limiting factor for stage speed is the performance of the stage at that speed. The stage may vibrate too much at high speeds, which could cause a loss of sensitivity. Movement of the stage can be configured to accommodate or minimize the effect of a large field of view or vibration.

In an instance, the stage containing the wafer is continuously moving while the AOIs 401 in FIG. 4 are imaged using an electron beam. A first AOI 401 is imaged during inspection. Then the electron beam is deflected to another AOI 401 for imaging. This process is repeated until all AOIs 401 are imaged.

The stage also can be fully or partly stationary during imaging with the electron beam. In an example, only the AOIs 401 of a large electron beam scan field, such as a 100 micron electron beam scan field, are imaged. The electron beam moves between AOIs 401 in the electron beam scan field by deflecting the electron beam without moving the stage.

Stage movement overhead can be minimized. In an example, it can take less than a second for the stage to stop, shift, and turn around for the next swath. Minimizing the number of times the stage needs to turn around can increase throughput. In another example, the stage is moved in a direction that captures the greatest amount of AOIs. The shape of this direction (e.g., straight, curved, etc.) can be configured to capture the greatest amount of AOIs. In yet another example, a combination of stage speeds and stage movement directions are used.

To minimize overhead, the scan pattern also may be designed to maximize the percentage of time the electron beam is imaging AOIs.

In an instance, the stage stays static and the system deflect electron beams to different locations within the maximum field of view of the system, taking multiple raster images of AOIs before moving the stage to next location to repeating the process. If the AOI density is very high, the AOI imaging time could be longer than the stage moving and settling time, which can reduce stage movement overhead.

In another instance, the stage is continuously moving, such as in x-direction or y-direction, while the electron beam scans in y-direction or x-direction (swath), respectively. One AOI is imaged and then an area is skipped before scanning the next AOI without changing swath direction. If the majority of time during the swath scan is imaging, the stage movement overhead can be reduced, which is the turnaround time at the end of swath near the wafer edge.

Figure 5:
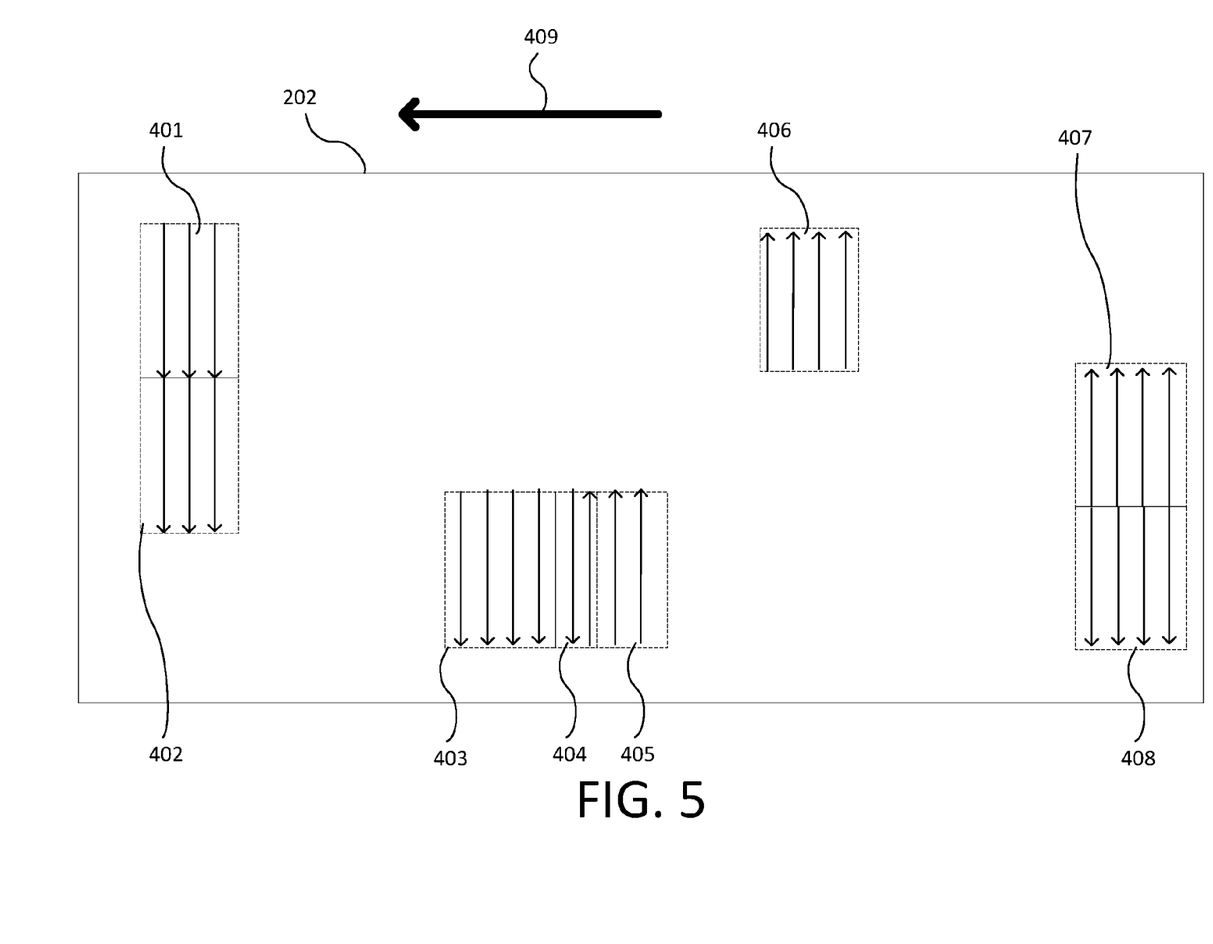
FIG. 5 represents an embodiment of swath AOI imaging using stage movement and electron beam scanning in accordance with the present disclosure.

FIG. 5 represents an embodiment of swath AOI imaging using stage movement and electron beam scanning. The AOIs are marked using boxes 401-407. As seen in FIG. 5, the scanning or rastering of the electron beam over the AOIs 401-407 can be in the same direction or in different directions. The scanning direction of the electron beam can vary based on optimization of the scan pattern of the electron beam. For example, the scan pattern can be optimized based on the locations, dimensions, or features of the AOIs 401-407 and/or the structure of the wafer or swath.

The sequence that the AOIs are imaged can vary. For example, the electron beam deflects to the nearest AOI after imaging a different AOI. In another example, the electron beam deflects to an AOI that is not the nearest AOI to the AOI that was imaged.

In an example, the electron beam is deflected to scan AOIs further along the stage motion. In an example, the electron beam can scan AOIs 401 and 402, then AOI 406, then AOIs 403 and 404, then AOIs 407 and 408, and then AOI 405.

The stage holding the wafer and the electron beam each can be scanned in two perpendicular directions. For example, the stage motion direction 409 is perpendicular to the scan direction of the electron beam in the AOIs 401-408.

The electron beam also can be deflected back to finish scanning areas passed earlier. Thus, if the electron beam only scanned half of, for example, AOI 402, the electron beam would return to finish scanning AOI 402 after scanning one or more other AOIs.

In yet another example, the electron beam is deflected to begin or finish scanning of AOIs in adjacent swaths. Thus, the electron beam could be deflected to swaths on a surface of the wafer adjacent to the swath 202 in FIG. 5.

While illustrated herein as straight lines for simplicity, the electron beam can raster to form a small field of view SEM image, such as an AOI. The location of the SEM image and the size of the SEM field of view are determined based on wafer-specific information. The electron beam can be deflected to a nearby location, such as a different AOI, and the action can be repeated. The electron beam raster direction can be an x-direction, a y-direction, a diagonal direction, or a combination thereof.

Raster and scan AOI SEM imaging can be performed on a stationary or moving stage. Stage movement may be continuous. The stage can be moved in the x-direction, y-direction, or any diagonal direction. The electron beam can be deflected while the stage is moving. In an example, the stage is continuously moving while the electron beam is deflected between locations.

Rastering also can be performed in four image directions for improved image quality. These four directions can be up, down, left, right, or a combination thereof. This also may be referred to as north, south, east, and west, which can add images together with different raster directions. Rastering also can have other shapes, such as diamond scan patterns, diagonals, other directions, or other combinations of directions. Rastering can vary based on the AOI shape, type, dimension, or position. Rastering also can be adjusted to optimize the wafer inspection.

Figure 6:
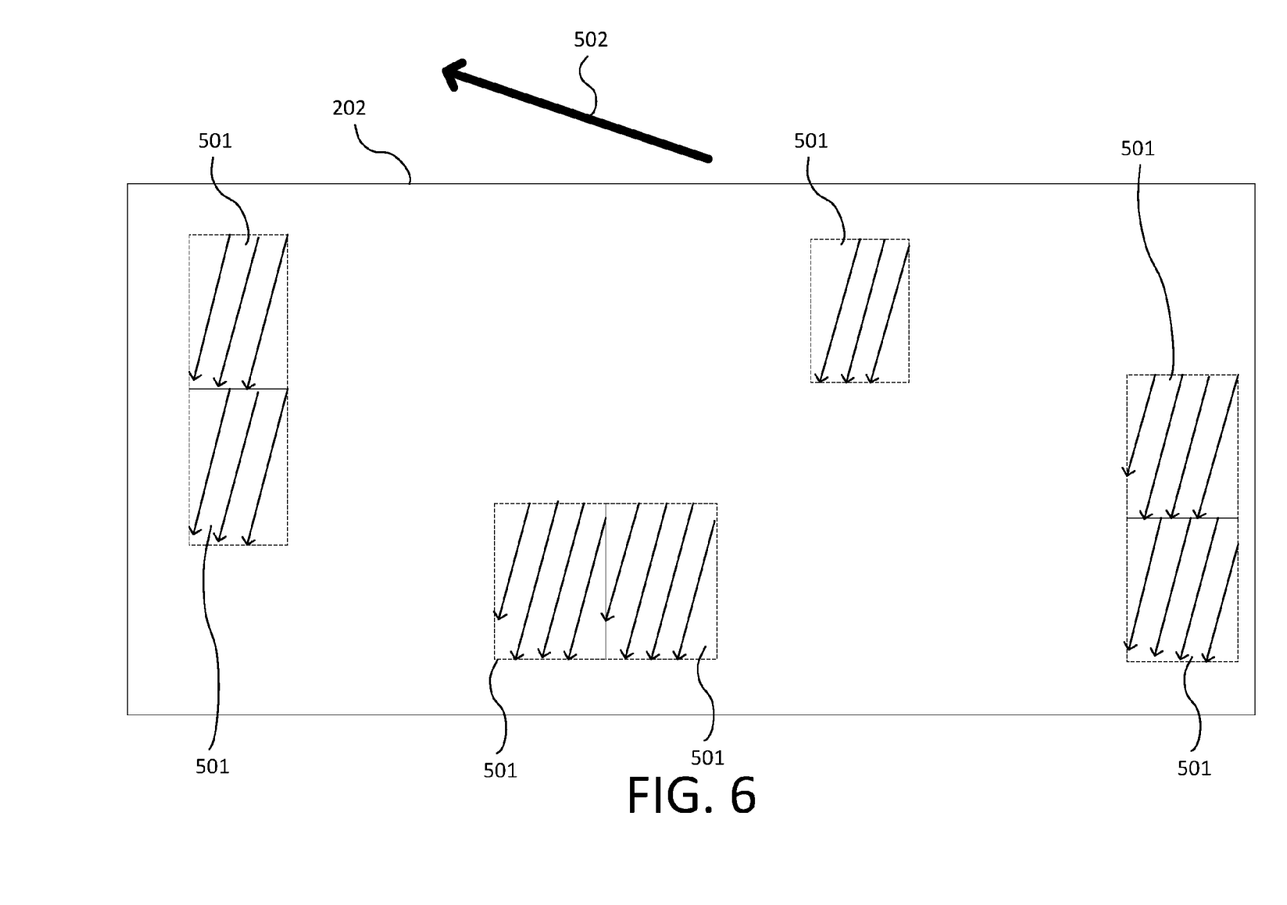
FIG. 6 represents an embodiment of swath AOI imaging using stage movement and electron beam scanning in a diagonal direction in accordance with the present disclosure.

FIG. 6 represents an embodiment of swath AOI imaging using stage movement and electron beam scanning in a diagonal direction. The AOIs are marked using boxes 501. The motion of the stage 502 and/or angle of the scan 503 of the AOIs 501 can be at an angle other than normal with respect to pattern geometry. In the example of FIG. 5, the scan of the electron beam or motion of the stage is perpendicular to edges of the AOIs 501. In FIG. 6, the motion of the stage 502 is at a non-perpendicular angle to the scan.

In an example, the beam deflection and/or stage motion is at a 45° angle relative to the pattern (e.g., the Manhattan) geometry. Thus, imaging can be performed with electron beam fast scan in the y-direction and continuous stage movement with a uniform speed in the x-direction, electron beam fast scan in the x-direction and continuous stage movement in the y-direction, electron beam fast scan at 45° and slow scan in 135°, or electron beam scan at 135° and stage movement at 45°. In this example, fast scan can be the raster, which is the movement of the beam across the wafer by the electron beam optics. Slow scan can be the stage movement or beam deflection in the direction opposite the rastering.

Use of a 45° angle can provide improved imaging because the electron beam provides cross-line scanning. The edges of the image may be improved compared to one where the scan direction is at a 90° angle with respect to the device features in the AOI.

Figure 7:
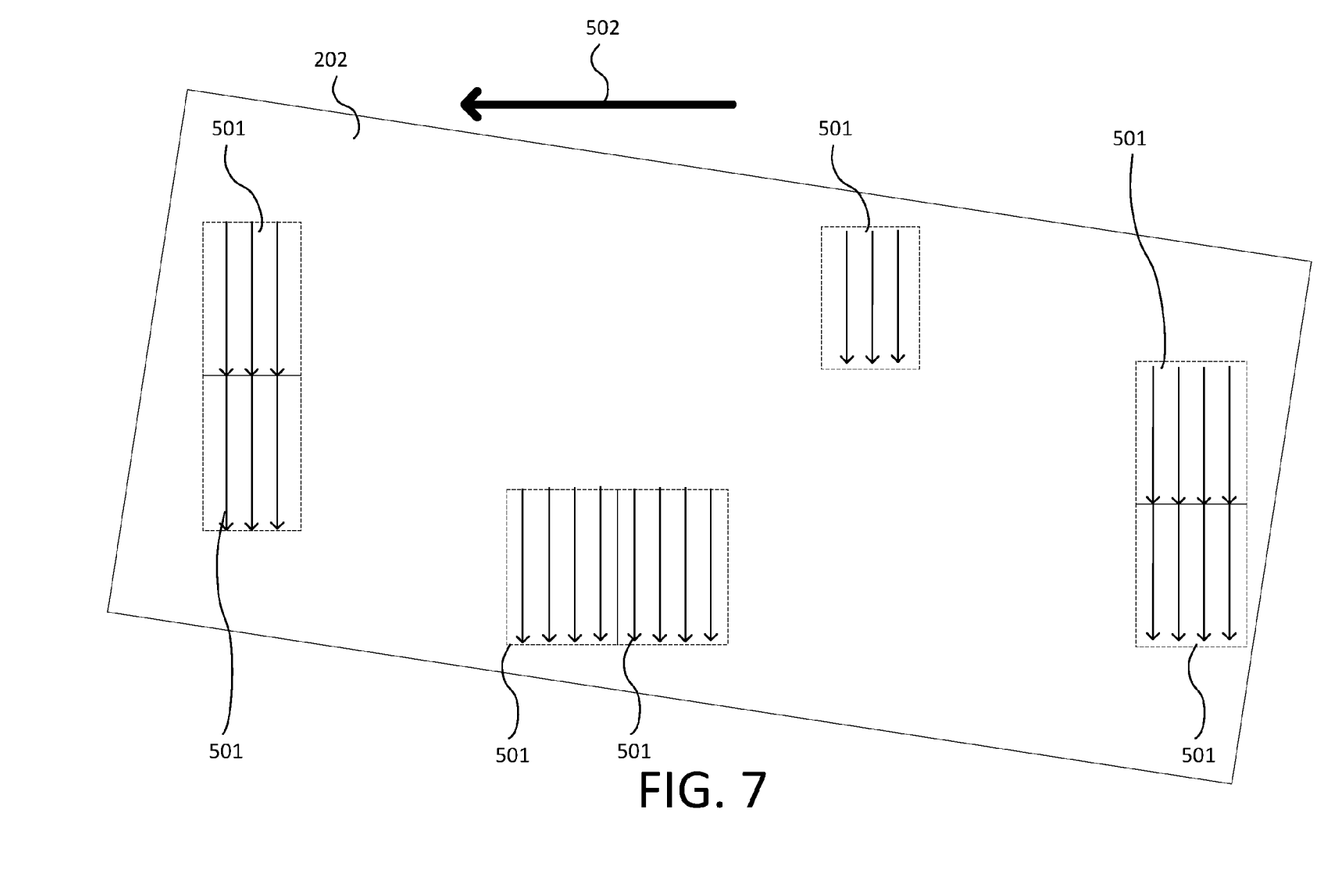
FIG. 7 represents an embodiment of swath AOI imaging in a diagonal direction.

FIG. 7 represents an embodiment of swath AOI imaging in a diagonal direction. In the example of FIG. 7, the wafer containing the swath 202 is offset on the stage such that sides of the swath 202 are not perpendicular to the motion of the stage 502, but the scan of the electron beam is perpendicular.

Figure 8:
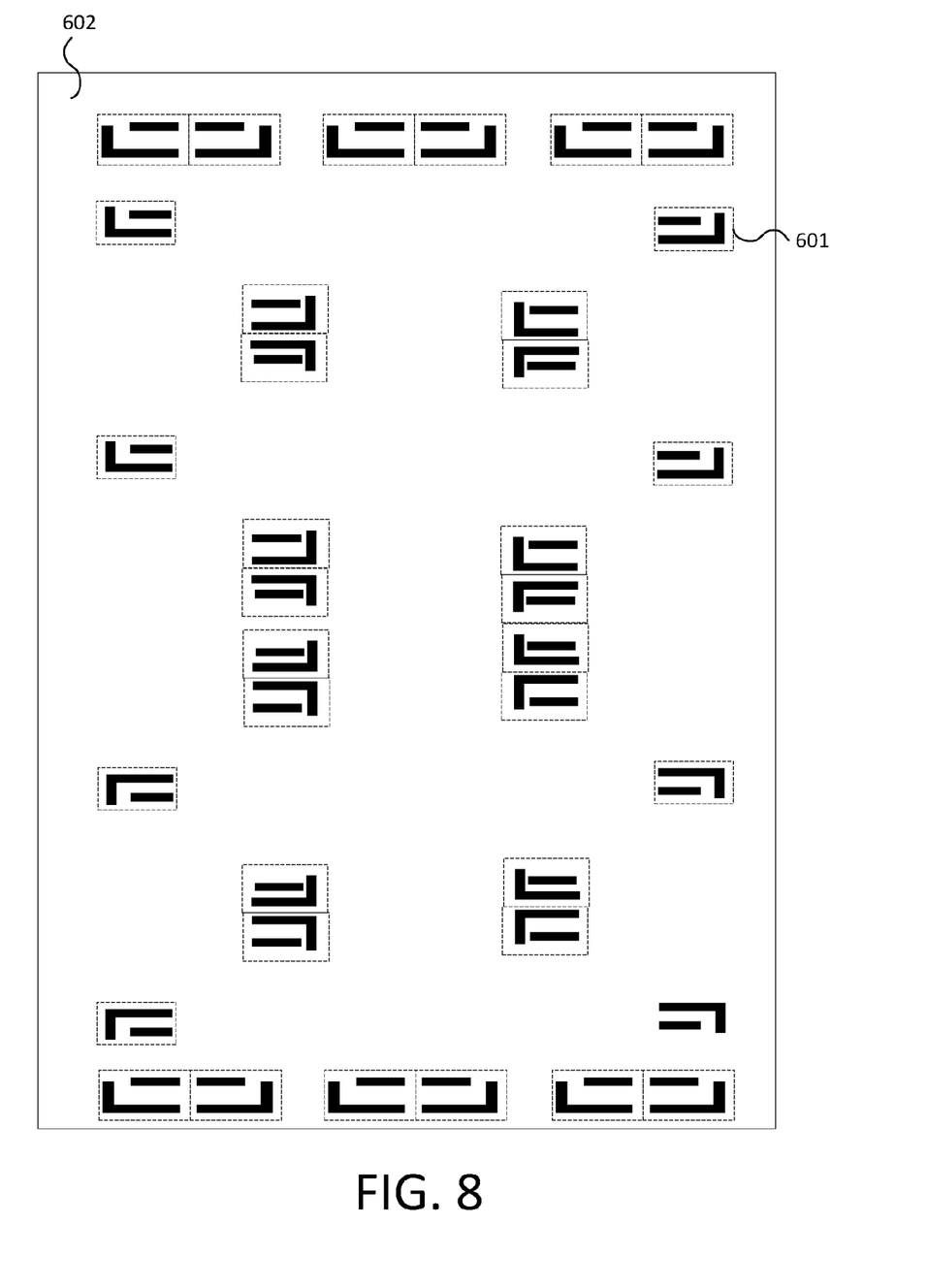
FIG. 8 represents step and scan large field of view imaging with imaging of only the AOIs.

FIG. 8 represents step and scan large field of view imaging with imaging of only the AOIs. FIG. 8 may be a 300 μm by 300 μm field of view that contains the AOIs 601, of which only one is marked in FIG. 8 for simplicity. By increasing the size of the swath 602, more AOIs 601 can be included. For example, compare the number of AOIs in FIG. 4 to FIG. 8.

The wafer in the embodiment of FIG. 8 may be scanned during imaging using the electron beam. The wafer in the embodiment of FIG. 8 also may be stationary as the electron beam images the AOIs in the field of view. In an example, the stage may be stationary while the electron beam images the swath 602. This can reduce stage overhead and improve inspection of the AOIs 601.

In another embodiment ("step and scan"), the stage motion is not constant. The stage is moved to a region of interest and then stopped. Then AOIs within the region are selectively scanned with an electron beam. Stage motion is re-started and a second region of interest is located. Another set of AOIs within the second region can be scanned. The process can be further repeated until all regions of interest or AOIs are imaged.

"Step and scan" may be have advantages for certain wafer designs. This may depend on hotspot density and how the density varies across a die.

Figure 9:
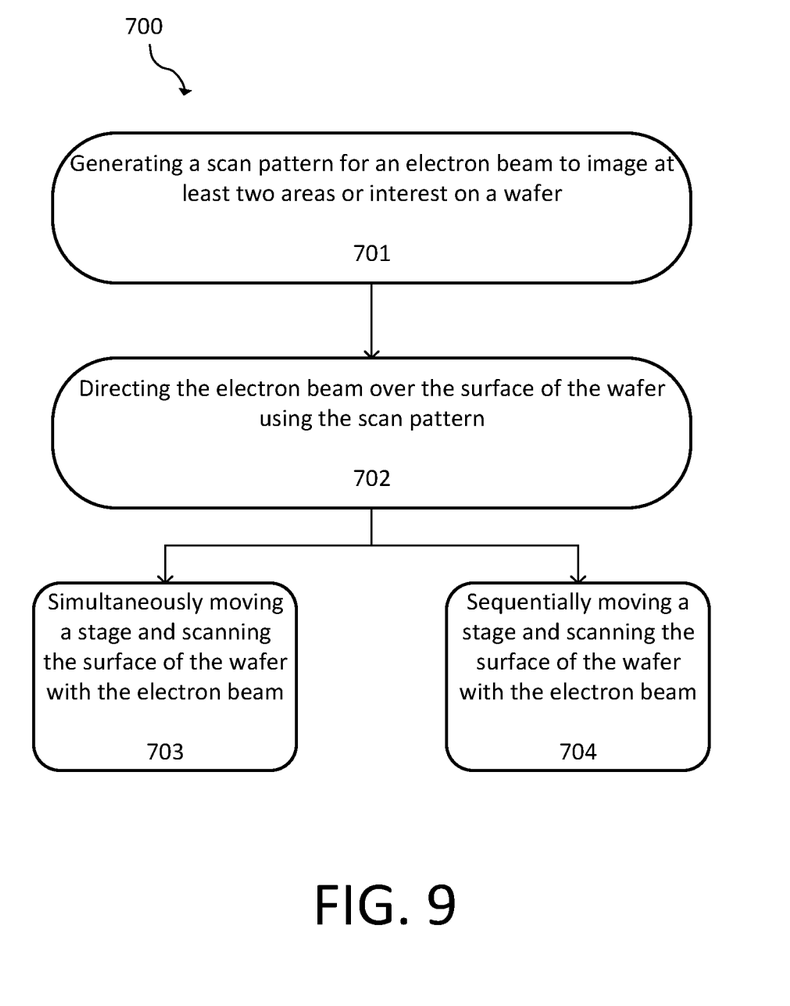
FIG. 9 is a flowchart of an embodiment in accordance with the present disclosure.

FIG. 9 is a flowchart of an embodiment of the scanning technique disclosed herein. In the method 700, a controller generates a scan pattern for an electron beam to image at least two AOIs on a wafer at 701. For example, the controller receives instructions including at least two AOIs in a swath of the wafer to be scanned by the electron beam. These instructions can be used to generate the scan pattern. At 702, an electron beam is directed over the surface of the wafer using the scan pattern.

The stage can be simultaneously moved while the electron beam scans the surface of the wafer at 703. The stage also can be sequentially moved with the electron beam scanning over the surface of the wafer at 704. The stage also can move relative to electron beam scanning using a combination of simultaneous and sequential movement across a surface of a wafer. Whether the stage is simultaneously or sequentially moved with the electron beam may be selected for improved optimization of the inspection.

A design database is used as a reference to image the AOIs. A user, such as a semiconductor manufacturer, can take a design of a wafer and designate AOIs. AOIs also may be detected by other inspection tools or from analysis of design files or models. Electrical tests and/or physical failure analysis also can be used to designate AOIs. Minor defects on the mask that have been classified as non-printable could also be used to designate AOIs. Other test results can be interpreted to designate AOIs. Other techniques to designate an AOI are possible.

A controller generates a scan pattern for the electron beam. The scan pattern may be generated automatically, semi-automatically, or manually. The scan pattern may be generated automatically using one or more pathfinding algorithms. For example, one such algorithm would identify AOIs and map them to nodes in a weighted or unweighted graph. In some embodiments, a design file or database for the wafer can be used to identify AOIs. In another embodiment, a user may input the AOIs. The pathfinding algorithm may search the graph by starting at one vertex and exploring adjacent nodes until all nodes have been traversed, generally with the intent of finding the shortest route. However, the shortest route may not be the most optimal route due to hardware and tooling limitations. In order to generate an optimal scan pattern, the controller may utilize a Bellman-Ford algorithm, A* algorithm, and Dijkstra's algorithm. Other algorithms may be used as will be readily apparent to one skilled in the art. A semi-automatically generated scan pattern may require input from a user. For example, the user may need to select relevant AOIs or provide preferences for scan pattern parameters (i.e., preferred direction, speed, distance traveled, etc.).

The controller generates a scan pattern that reduces overhead, improves efficiency, and/or increases throughput. Dwell time of the electron beam on the surface of the wafer between the AOIs can be minimized. Image quality and sensitivity can be optimized.

The controller may generate a scan pattern that is optimized for a given wafer. For example, the scan pattern may minimize dwell time of the electron beam on a surface of the wafer. Scan patterns for particular wafers may be stored in a database, such that the scan pattern need not be recalculated.

The scan pattern may be different for each wafer. This may be due to different device designs on the wafer. This also may be based on a need to inspect potential problem areas on one wafer versus another wafer.

Reference points on a wafer can be used during scanning of the AOIs. For example, a die corner or other features can be used as a reference point.

Figure 10:
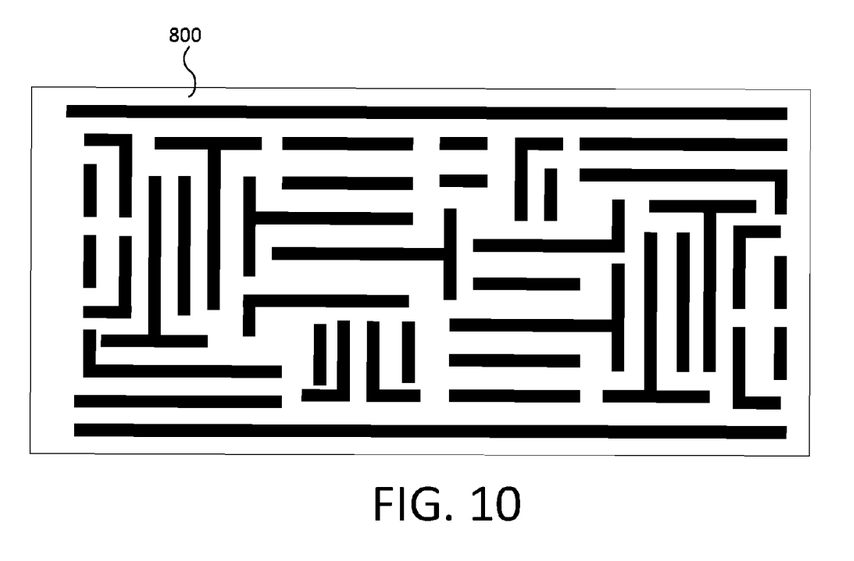
FIG. 10-12 represents generating a scan pattern for a swath.
Figure 11:
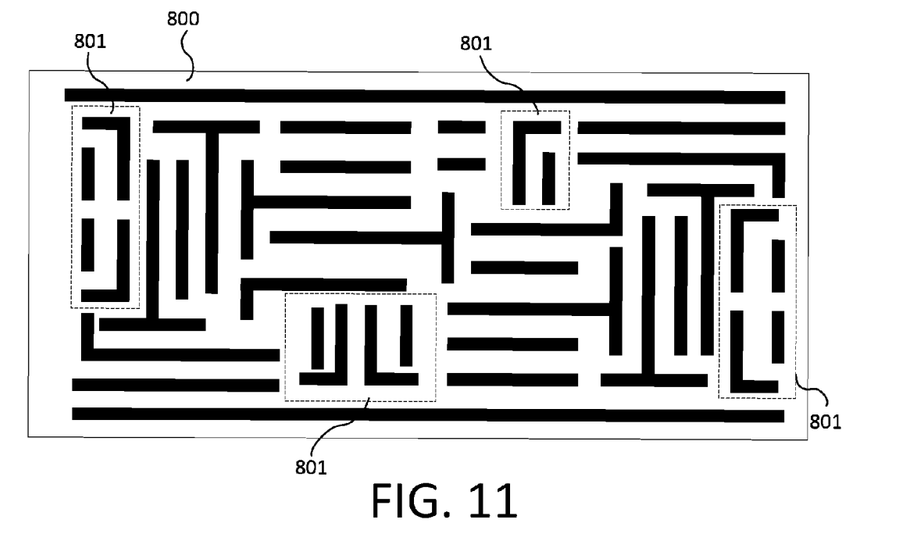
Figure 12:
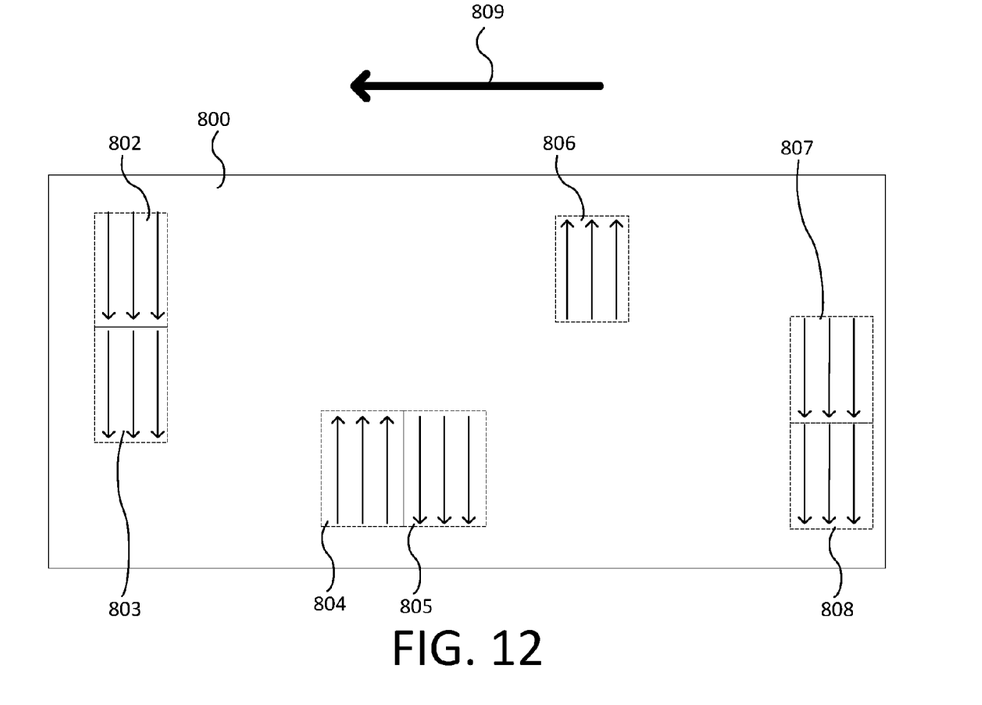

FIG. 10-12 represents generating a scan pattern for a swath 800. In FIG. 10, a design database of a swath 800 is illustrated. A user selects the AOIs 801 for the swath 800 in FIG. 11. In FIG. 12, a controller generates a scan pattern for the swath 800 using the AOIs 801 selected by the user, as seen in FIG. 11. The scan pattern in FIG. 12 includes a scan direction (illustrated by arrows), an order of scanning the AOIs 802-808, and a stage movement direction 809. In this example, the scan pattern may scan the AOIs 802-808 sequentially (i.e., 802, 803, 804, 805, 806, 807, then 808).

At least one stage speed and at least one raster pattern (or scan direction) is selected based on the AOIs 802-808 in the swath 800. The scan pattern can be generated to capture the AOIs 802-808 while minimizing inspection time or otherwise optimizing inspection.

The electron beam dimensions to image an AOI may be smaller than electron beams used to inspect an entire swath. For example, the field of view for the electron beam may be 1 μm or less. A smaller beam may be more sensitive. However, a smaller beam has a lower beam current density, so a smaller beam will run slower than a larger beam with higher beam current density. With techniques disclosed herein, it is still possible to achieve high throughput even with a smaller beam. Sensitivity can be optimized while still achieving the same throughput.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An inspection tool comprising:
   an electron beam generator unit configured to generate an electron beam;
   a stage configured to clamp a wafer;
   at least one actuator configured to move the stage;
   electron beam optics configured to direct the electron beam at a surface of the wafer;
   a detector configured to detect electrons from the electron beam; and
   a controller in electronic communication with at least the electron beam optics and the actuator, wherein the controller is configured to:
      receive instructions including at least two areas of interest in a swath of the wafer to be scanned by the electron beam;
      generate a scan pattern for the electron beam to image the areas of interest on the wafer, wherein the scan pattern minimizes dwell time of the electron beam on the surface of the wafer between the areas of interest, and wherein the controller selects at least one stage speed and at least one raster pattern based on the areas of interest in the swath; and
      send instructions to the electron beam optics to direct the electron beam at the areas on the surface of the wafer using the scan pattern.

2. The inspection tool of claim 1, wherein the electron beam optics are configured to scan the electron beam across the surface of the wafer in two perpendicular directions.

3. The inspection tool of claim 1, wherein the stage is configured to move in two perpendicular directions.

4. The inspection tool of claim 1, wherein the controller is configured to send instructions to move the stage while the electron beam optics scans the electron beam.

5. The inspection tool of claim 1, wherein the controller is further configured to use a reference point on the wafer to generate the scan pattern for the wafer.

6. The inspection tool of claim 1, wherein the controller is further configured to generate the scan pattern to capture the areas of interest while minimizing inspection time.

7. A method comprising:
   generating a scan pattern for an electron beam to image at least two areas of interest in a swath of a wafer, wherein the scan pattern minimizes dwell time of the electron beam on the surface of the wafer between the areas of interest, and wherein at least one stage speed and at least one raster pattern are selected for the scan pattern based on the areas of interest in the swath; and
   directing the electron beam over the surface of the wafer using the scan pattern.

8. The method of claim 7, further comprising moving a stage clamping the wafer.

9. The method of claim 8, wherein the moving is configured to be in two perpendicular directions.

10. The method of claim 8, wherein the moving and the directing are sequential.

11. The method of claim 8, wherein the moving and the directing are simultaneous.

12. The method of claim 8, wherein the moving is at a constant speed during the directing.

13. The method of claim 8, wherein the wafer further comprises at least one area of interest in a different swath, and wherein the scanning occurs in the different swath of the wafer during the moving.

14. The method of claim 8, wherein the moving and the directing are not at normal angles with respect to each other.

15. The method of claim 14, wherein the moving and the directing are at a 45° angle with respect to each other.

16. The method of claim 7, wherein the directing is configured to be in two perpendicular directions.

17. The method of claim 7, wherein the directing includes only partially directing the electron beam over one of the areas of interest and further comprising completing the directing of the electron beam over the area of interest after directing the electron beam over another of the areas of interest.

18. The method of claim 7, wherein the generating further comprises capturing the areas of interest while minimizing inspection time.

* * * * *